United States Patent [19]

Murata

[11] Patent Number: 5,010,263
[45] Date of Patent: Apr. 23, 1991

[54] HALL EFFECT TYPE SENSING DEVICE

[75] Inventor: Shigemi Murata, Himeji, Japan

[73] Assignee: Mitsubishi Denki Kabushiki Kaisha, Tokyo, Japan

[21] Appl. No.: 479,921

[22] Filed: Feb. 14, 1990

[30] Foreign Application Priority Data

Feb. 21, 1989 [JP] Japan ................................. 1-39455
Feb. 23, 1989 [JP] Japan ................................. 1-41884

[51] Int. Cl.$^5$ .............................................. F01B 7/14
[52] U.S. Cl. ................................... 310/68 B; 324/207.2
[58] Field of Search ........ 310/68 B, DIG. 3, DIG. 6, 310/67 R; 307/309, 278; 324/207, 208, 251

[56] References Cited

U.S. PATENT DOCUMENTS 4,359,978 11/1982 Brammer et al. .
4,703,261 10/1987 Berchtold ........................... 307/309

Primary Examiner—Steven L. Stephan
Assistant Examiner—Matthew Nguyen
Attorney, Agent, or Firm—Sughrue, Mion, Zinn, Macpeak and Seas

[57] ABSTRACT

A Hall effect type sensing device comprises a magnetic circuit forming member; a Hall transducing element arranged in the magnetic circuit formed by the magnetic circuit forming member; a frame body having a holding part for locating and holding the magnetic circuit forming member and the Hall transducing element, the frame body being prepared by primary molding; and an armor member for surrounding the magnetic circuit forming member and the Hall transducing element together with the frame body, the armor member being prepared by secondary molding.

3 Claims, 5 Drawing Sheets

HALL EFFECT TYPE SENSING DEVICE

BACKGROUND OF THE INVENTION

1. FIELD OF THE INVENTION

The present invention relates to a Hall effect type sensing device which can be preferably used to detect e.g. a crank angle in an ignition timing control apparatus for internal combustion engines.

2. DISCUSSION OF BACKGROUND

There have been widely known various types of sensing device utilizing the Hall effect, such as a position sensor, an angle sensor and a speed sensor. A Hall IC formed by integrating and packaging a Hall transducing element used for such sensing devices has been also known. In addition, there has been known a Hall effect type sensing device for controlling ignition timing in internal combustion engines, wherein the Hall IC and a magnetic circuit are integrally assembled by a resin material.

In order to assemble such conventional Hall effect type sensing devices, the positions of components such as a Hall IC and magnetic circuit parts are located by using jigs for the respective components, a thermosetting resin is injected onto the components thus located, and the resin is cured in a heating furnace. Determining the positions of the components requires various kinds of jigs, however, and the positioning accuracy is poor. As a result, the structure of the conventional Hall effect type sensing device creates problems in that it is not suitable for large scale production, and its output signals have poor accuracy.

SUMMARY OF THE INVENTION

It is an object of the present invention to eliminate the problems of the conventional Hall effect type sensing device, and to provide a new and improved Hall effect type sensing device capable of easily determining the positions of the components, outputting high accuracy signals, and facilitating assemblage in an automated production line.

The foregoing and other objects of the present invention have been attained by providing a Hall effect type sensing device comprising a magnetic circuit forming member; a Hall transducing element arranged in the magnetic circuit formed by the magnetic circuit forming member; a frame body having a holding part for locating and holding the magnetic circuit forming member and the Hall transducing element, the frame body being prepared by primary molding; and an armor member for surrounding the magnetic circuit forming member and the Hall transducing element together with the frame body, the armor member being prepared by secondary molding.

The frame body according to the present invention can locate and hold the magnetic circuit forming member and the Hall transducing element with the holding part, facilitating assemblage of the whole sensing device and eliminating jigs required for locating these components.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Now, the present invention will be described in detail in reference to preferred embodiments illustrated in the accompanying drawings.

Figure 1:
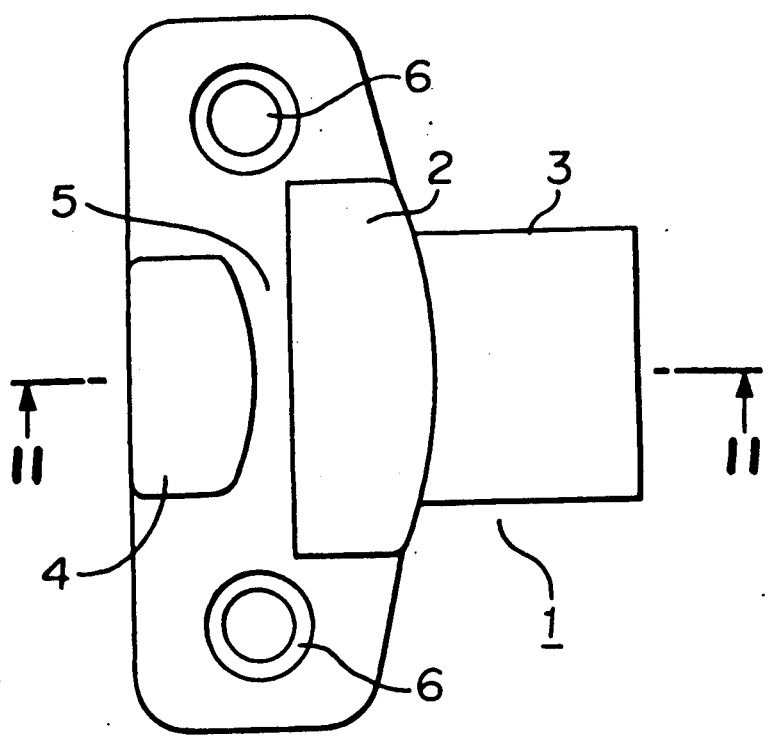
FIG. 1 is a plan view of a first embodiment of the Hall effect type sensing device according to the present invention.
Figure 2:
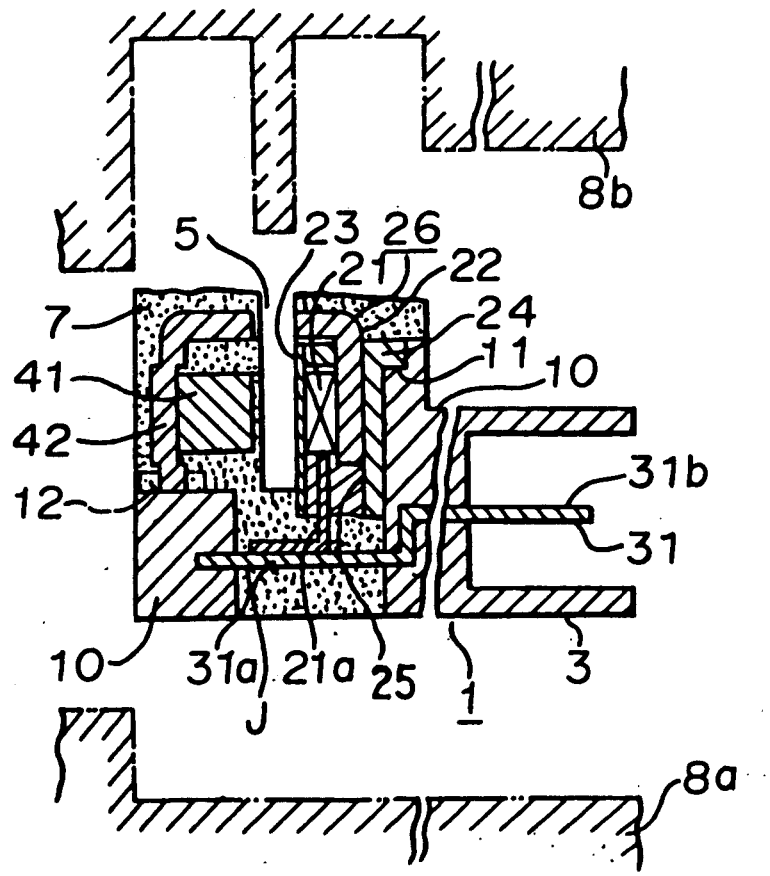
FIG. 2 is a cross sectional view taken on line II—II of FIG. 1.
Figure 3:
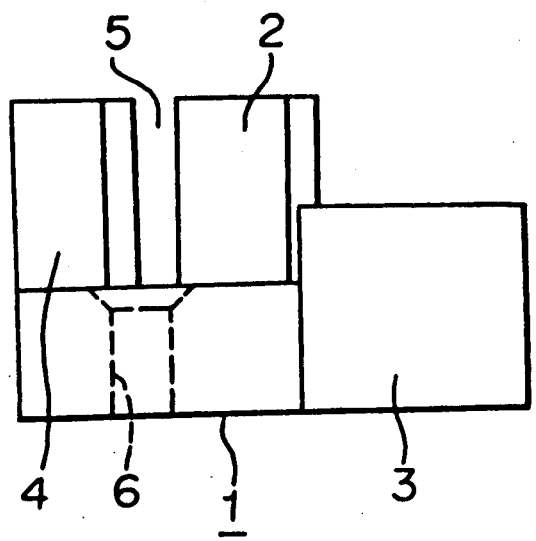
FIG. 3 is a side view of the embodiment of FIG. 1.

FIG. 1 is a plan view of a first embodiment of the Hall effect type sensing device according to the present invention. FIG. 2 is a cross sectional view taken on line II—II of FIG. 1. FIG. 3 is a side view of the first embodiment. The sensing device of the first embodiment is suited for detecting a crank angle in an internal combustion engine.

Figure 4:
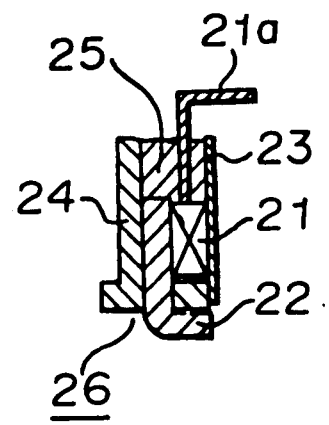
FIG. 4 is a cross sectional view showing the sensor assembly shown in FIG. 2.

As shown, the Hall effect type sensing device 1 includes a detecting part 2, a connector part 3, a magnet part 4, a gap part 5, and mounting parts 6. A frame body 10 which is made of synthetic resin and shaped by injection molding in primary molding forms the connector part 3 and the mounting parts 6, has holding parts 11 and 12, and has inserted conductors 31 embedded integrally in it. The inserted conductors are used to take out an output signal from the detection part. The inserted conductors 31 have exposed parts 31a which are not embedded by the frame body 10. The inserted conductors 31 have ends forming connecting pieces 31b of the connector part 3. The holding part 11 of the frame body holds a sensor assembly 26 as the detecting part. The sensor assembly 26 is constituted by a Hall IC 21, a magnetic flux guide 22, a protection plate 23, a holder 24 for holding these parts, and a sealing material 25. The sensor assembly 26 can be previously prepared in a separate process. In the separate process, the magnetic flux guide 22, the Hall IC 21, and the protection plate 23 made of a non-magnetic material such as stainless steel are held by the holder 24 (a holding mechanism is not shown). Then, the assembly thus prepared is turned upside down as shown in FIG. 4, and the container-like recessed portion which is defined by the holder 24 and the protection plate 23 is filled with the sealing material 25 such as silicone gel to complete the assembly. The Hall IC 21 has lead wires 21a led out of its main body. The lead wires are electrically connected to the exposed portions 31a of the inserted conductors 31 by e.g. spot welding at J in FIG. 2.

The holding part 12 which is formed on the frame body 10 holds a magnetic flux guide 42 which in turn holds a magnet 41 by means of e.g. an adhesive. An armor member 7 is used to surround the whole surface of the connection part J, the sensor assembly 26 and the frame body 10 as one body. The armor member 7 can be a protective component made of thermosetting resin or thermoplastic resin by secondary molding using e.g. molds indicated by 8a and 8b in FIG. 2.

Because the frame body 10 is provided with the holding parts 11 and 12 as explained earlier, the components (the Hall IC 21, the magnetic flux guide 22, the magnet 42, the magnetic flux guide 41 and so on) can be held by the holding parts 11 and 12 to eliminate jigs required for locating the components at the time of carrying out the secondary molding using the molds 8a and 8b, facilitating the assemblage of the sensing device. In addition, the positioning accuracy of the components can be easily increased, offering a sensing device having high accuracy. Further, the armor member 7 prepared by the secondary molding surrounds the connection part J, the magnetic circuit forming members 22, 41 and 42, and so on to offer advantages in that the sensing device thus prepared has good resistance to corrosion and is mechanically rigid.

The sensing device having the structure described above can be constituted so that a shutter part of a magnetic flux shutter having a cylindrical shape or a disk like shape moves in the gap part 5. When the magnetic flux shutter is rotated, the change in the magnetic flux which depends on the rotation of the magnetic flux shutter is sensed by the Hall IC 21. The Hall IC 21 outputs an electric signal which depends on the rotation of the magnetic flux shutter based on the well known Hall effect. The electric signal is taken out through the connector part 3, and is subjected to processing such as waveform shaping by a processing circuit not shown. When the Hall effect type sensing device 1 is utilized in e.g. an ignition timing control apparatus for an internal combustion engine, the sensing device 1 is housed in e.g. the housing of a distributor (the distributor and its housing are not shown for the sake of clarity). The magnetic flux shutter can be rotated in synchronism with the operation of the engine to detect e.g. a crank angle, thereby controlling the ignition timing based on the detected crank angle.

Figure 5:
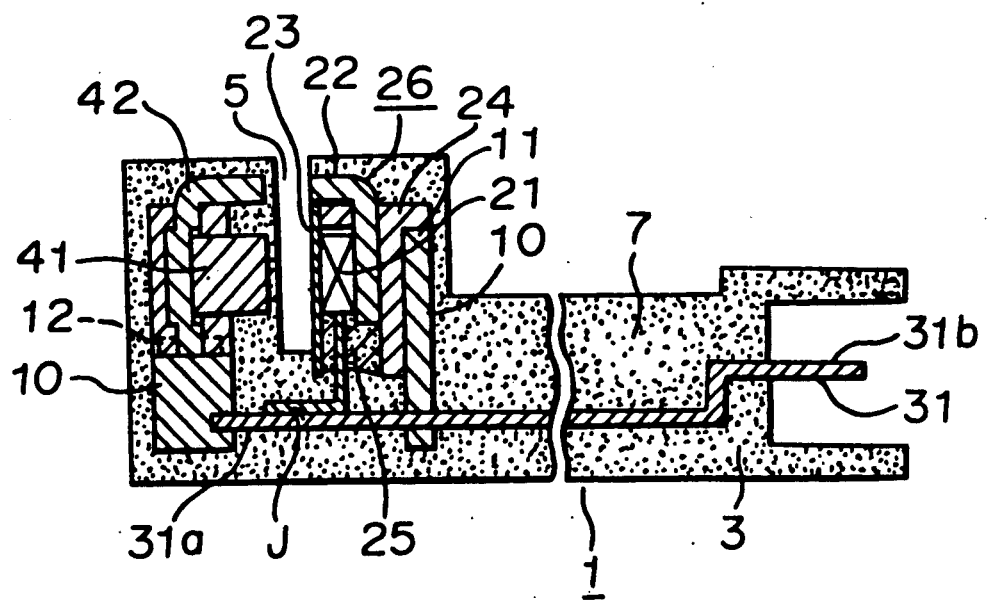
FIG. 5 is a cross sectional view similar to FIG. 2 depicting a second embodiment of the sensing device according to the present invention.

FIG. 5 is a cross sectional view showing the essential parts of a second embodiment of the sensing device according to the present invention, wherein the connector part 3 is formed as an extension of the armor member 7 during the secondary molding.

Figure 6:
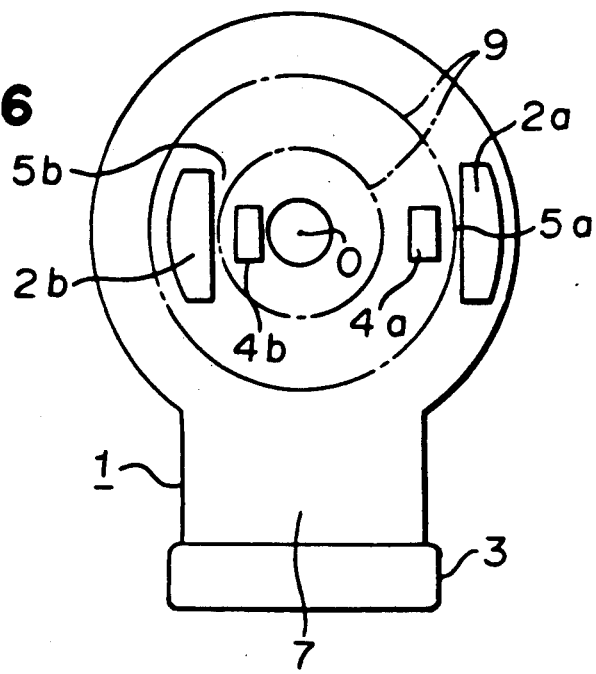
FIG. 6 is a plan view of a third embodiment of the sensing device according to the present invention.

FIG. 6 is a plan view showing a third embodiment of the sensing device according to the present invention. In the third embodiment, two magnetic flux shutters 9 are arranged to revolve about a rotary shaft O, and two sensing devices are also arranged to be associated with the respective magnetic flux shutters. Reference numerals 2a and 2b designate detecting parts, reference numerals 4a and 4b indicate magnet parts, and reference numerals 5a and 5b indicate gap parts. The sensing device can be utilized so that one of the sensing devices detects a reference angle position, and the other detects a rotation angle.

Although the sensing device according to the first through third embodiments is constructed so that the Hall IC 21 and the magnetic flux guide 22 are located and held by the holding part 11 of the frame body 10 through the holder 24, the present invention is not necessarily limited to such structure. The Hall IC and the magnetic flux guide can be located and held directly by the holding part 11. In addition, the sensing device of the first through third embodiments to may be modified, e.g. such that the positions of the Hall IC 21 and the magnet 41 are interchanged, or that the magnet 41 and the Hall IC 21 are held together by the holder 24. Further, the positions, the shapes and the number of the holding parts 11 and 12 are not limited to those of the first through third embodiments.

Figure 7:
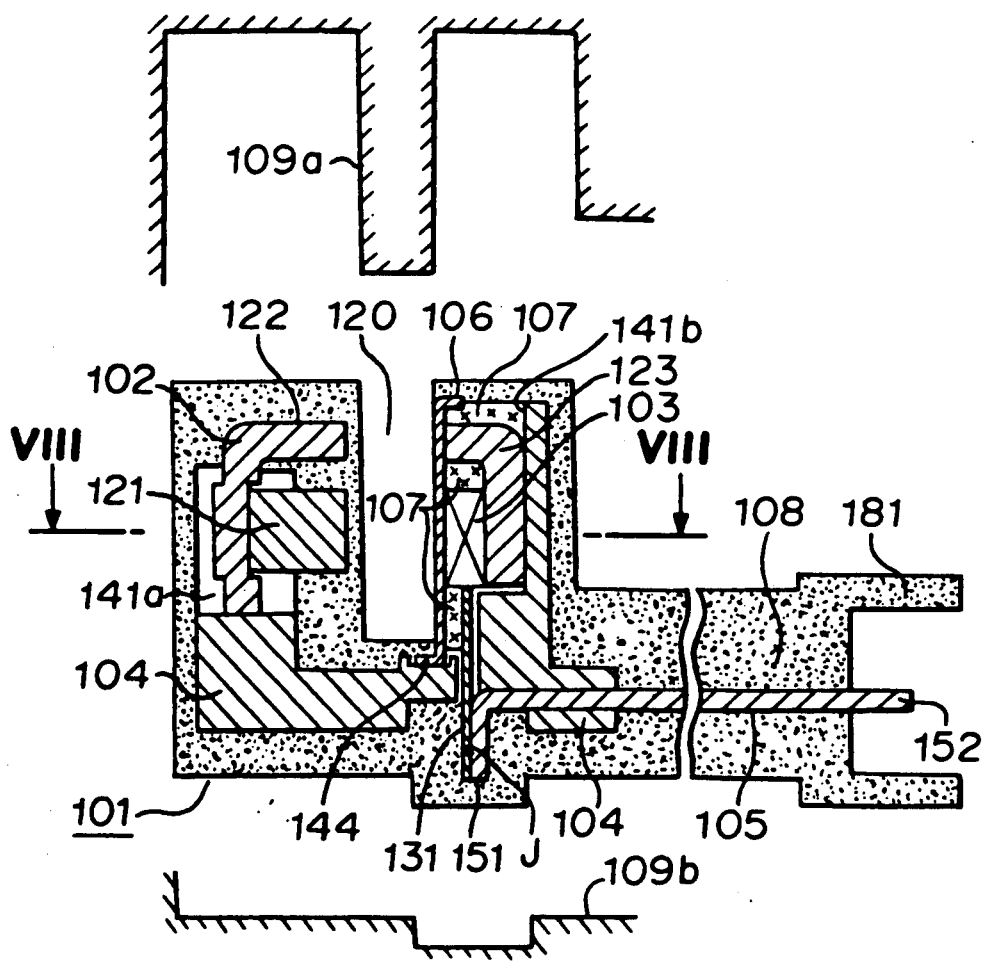
FIG. 7 is a fourth embodiment of the sensing device according to the present invention.
Figure 8:
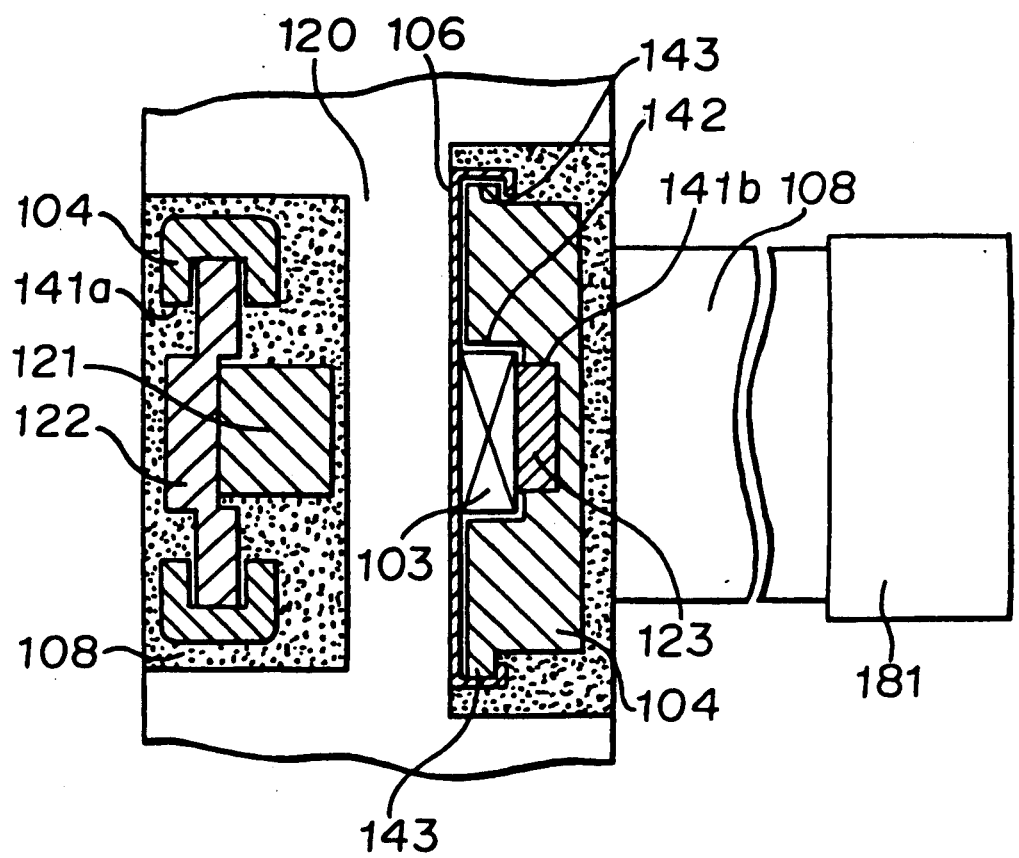
FIG. 8 is a plan and cross sectional plan view taken on line VIII—VIII of FIG. 7.

A fourth embodiment of the present invention will be described in detail with reference to the accompanying drawings. FIG. 7 is a cross sectional view of the fourth embodiment of the Hall effect type sensing device according to the present invention. FIG. 8 is a cross sectional plan view taken on line VIII—VIII of FIG. 7. The fourth embodiment is also constructed to be suitable for a sensing device for detecting a crank angle in an internal combustion engine.

As shown in FIGS. 7 and 8, the Hall effect type sensing device 101 according to the present invention includes a magnetic circuit forming member 102 with a gap 120, and a Hall IC 103 arranged in the magnetic circuit formed by the magnetic circuit forming member 102. The magnetic circuit forming member 102 is constituted by a magnet 121, a first magnetic flux guide 122, and a second magnetic flux guide 123. A frame body 104 which is made of a thermosetting resin or a thermoplastic resin and is formed by primary molding has inserted conductors 105 integrally embedded in it. The frame body 104 is provided with holding parts 141a and 141b for locating and holding the magnetic circuit forming member 102, a holding part 142 for locating and holding the Hall IC 103, and holding parts 143 and 144 for holding a plate 106 which is made of a non-magnetic material and protects the surface of the Hall IC 103 facing the gap 120. The Hall IC 103 has lead wires 131 which are electrically connected to ends 151 of the inserted conductors 105 by e.g. spot welding at a connection part J. The space which is formed by locating and holding the Hall IC 103 and the second magnetic flux guide 123 to the frame body 104, and mounting the plate 106 is filled with thixotropic silicone gel 107 having low mobility. An armor member 108 is used to surround the frame body 104, and the magnetic circuit forming member 102 and the Hall IC 103 held by the frame body 104, and forms a connector 181 at the other ends 152 of the inserted conductors 105. The armor member 108 can be made of the same material as or a material different from the frame body 104, and be molded using molds comprising e.g. an upper mold 109a and a lower mold 109b. The magnet 121 is previously bonded to the first magnetic flux guide 122 with an adhesive.

Because the sensing device of the fourth embodiment is constructed so that the frame body 104 can locate and hold the Hall IC 103 and the magnetic circuit forming member 102, and that the frame body 104, the Hall IC 103 and the magnetic circuit forming member 102 are integrally surrounded by the armor member 108, jigs required for fixing the Hall IC, the magnetic circuit forming member and so on can be eliminated, allowing the positioning accuracy of the respective parts to be easily increased. In addition, the components can be located and held by fitting the components in predetermined positions in assemblage of the sensing device, facilitating automation in assemblage. Further, the structure of the sensing device can eliminate the presence of the exposed portions of the components to make the sensing device have good resistance to corrosion and so on. In addition, improved fixity of the components can increase the strength of the device, and increased positioning accuracy can offer a sensing device having high accuracy.

Figure 9:
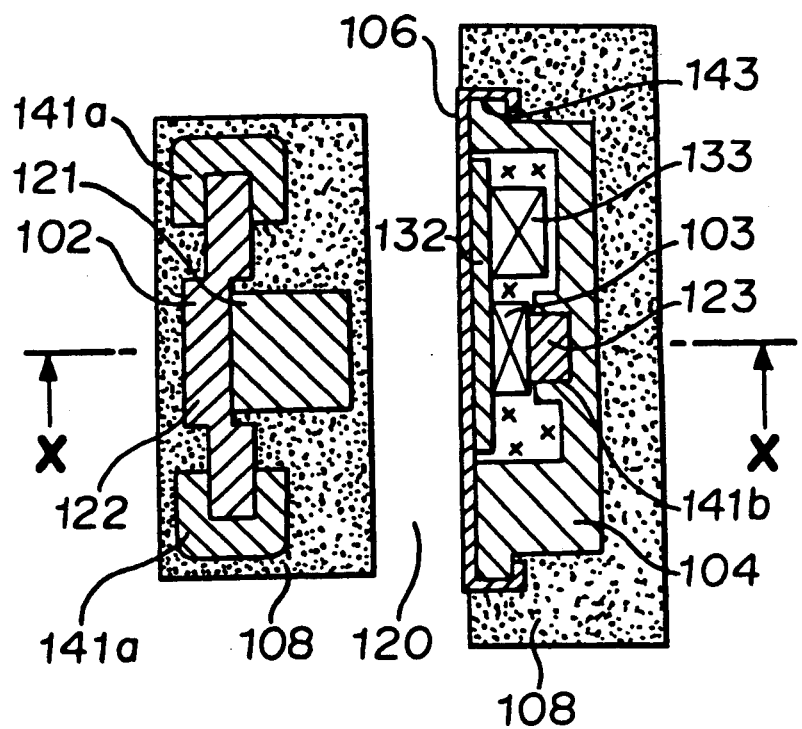
FIG. 9 is a cross sectional view taken on line IX—IX of FIG. 10, depicting a fifth embodiment of the sensing device according to the present invention.
Figure 10:
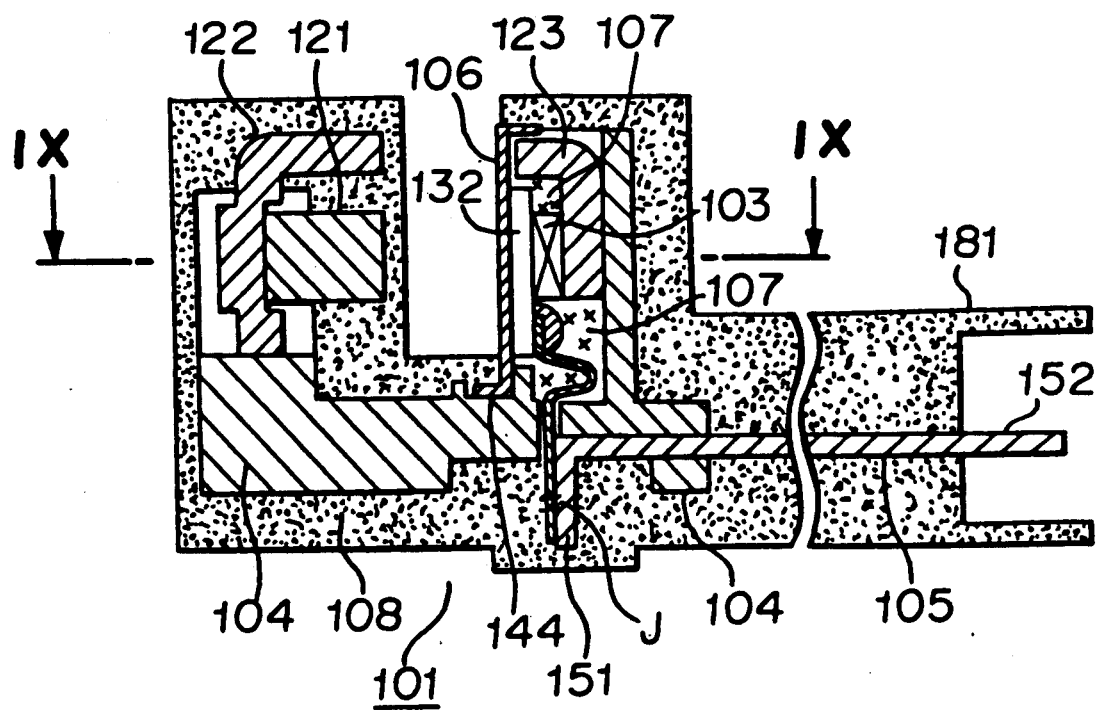
FIG. 10 is a cross sectional view taken on line X—X of FIG. 9.

FIGS. 9 and 10 show the essential parts of the sensing device of a fifth embodiment according to the present invention. In FIGS. 9 and 10, reference numeral 132 designates a board, and reference numeral 133 designates a signal processing IC which is provided on the board 132 and carries out wave shaping of an output signal from the Hall IC 103. Parts indicated in other reference numerals are the same as those of the sensing device shown in FIGS. 7 and 8, and explanation on such parts is omitted for the sake of clarity. In the fifth embodiment, the signal processing circuit is integrally incorporated in the sensing device to offer a Hall effect type sensing device which is compact and easy to handle.

Although in the fourth and the fifth embodiments, the sensing device is constructed so that the Hall IC 103 and the second magnetic flux guide 123 are arranged at the right side, and the first magnetic flux guide 122 and the magnet 121 are arranged at the left side, the present invention is not limited to such structure. The sensing device of the embodiments may to be modified, e.g. such that the positions of the Hall IC 103 and the magnet 121 are interchanged, or that the magnet 121 is arranged at the same side as the Hall IC 103. In addition, required or desired modification can be made to the embodiments. For example, a plurality of detection units comprising the magnetic circuit forming members 102 and the Hall ICs 103 can be arranged. Further, the Hall IC 103 can be in the shape of a bare chip.

Although the explanation on the first and fifth embodiments has been made in reference to the case wherein the sensing device according to the present invention is utilized to detect a crank angle in the ignition timing control apparatus, the sensing device is applicable to other applications. For example, the magnetic flux shutter can be linearly moved, or the sensing device can be used as a positioning sensor or a speed sensor.

Obviously, numerous modifications and variations of the present invention are possible in light of the above teachings. It is therefore to be understood that within the scope of the appended claims, the invention may be practiced otherwise than as specifically described herein.

What is claimed is:

1. A Hall effect type sensing device, comprising:
   magnetic circuit forming means including a permanent magnet;
   a Hall transducing element arranged in a magnetic circuit formed by the magnetic circuit forming means;
   a frame body having a holding part for locating and holding the magnetic circuit forming means and the Hall transducing element in predetermined positions, the frame body being prepared by primary molding; and
   a protective compound encapsulating the magnetic circuit forming means, the permanent magnet, and the Hall transducing element together with the frame body to prevent any relative movement therebetween, the protective compound being prepared by secondary molding and defining a gap in the magnetic circuit forming means, a movable shutter, and said gap adapted to accommodate said movable shutter.

2. A Hall effect type sensing device according to claim 1, further comprising conductors inserted in the frame body for taking out an output signal from the Hall transducing element, and lead wires led out of the main body of the Hall transducing element, the lead wires being electrically connected to exposed portions of the inserted conductors.

3. A Hall effect type sensing device according to claim 2, wherein connections between the lead wires of the Hall transducing element and the exposed portions of the inserted conductors are surrounded by the protective compound.

* * * * *